United States Patent
Cui et al.

(10) Patent No.: US 9,876,195 B2
(45) Date of Patent: Jan. 23, 2018

(54) METHOD FOR PACKAGING ORGANIC LIGHT-EMITTING DIODE APPARATUS, ORGANIC LIGHT-EMITTING DIODE PACKAGING APPARATUS AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventors: Fuyi Cui, Beijing (CN); Xu Chen, Beijing (CN); Quanqin Sun, Beijing (CN)

(73) Assignees: BOE TECHNOLOGY GROUP CO., LTD. (CN); ORDOS YUANSHENG OPTOELECTRONICS CO., LTD. (CN)

( * ) Notice: Subject to any disclaimer, the term of this patent is extended or adjusted under 35 U.S.C. 154(b) by 0 days.

(21) Appl. No.: 15/259,428

(22) Filed: Sep. 8, 2016

(65) Prior Publication Data
US 2017/0200917 A1 Jul. 13, 2017

(30) Foreign Application Priority Data

Jan. 13, 2016 (CN) .......................... 2016 1 0021164

(51) Int. Cl.
*H01L 51/00* (2006.01)
*H01L 51/52* (2006.01)
*H01L 51/56* (2006.01)

(52) U.S. Cl.
CPC ...... *H01L 51/5259* (2013.01); *H01L 51/0005* (2013.01); *H01L 51/56* (2013.01)

(58) Field of Classification Search
CPC .. H01L 51/5259; H01L 51/56; H01L 51/0005
See application file for complete search history.

(56) References Cited

U.S. PATENT DOCUMENTS

| 8,791,023 B2* | 7/2014 | Ellinger ............ H01L 29/42384 257/632 |
| 9,616,644 B2* | 4/2017 | Kim .................... B32B 37/0053 |
| 9,627,452 B2* | 4/2017 | Lim ..................... H01L 27/322 |
| 2012/0256202 A1 | 10/2012 | Lee et al. |
| 2012/0313516 A1 | 12/2012 | Kim et al. |

(Continued)

FOREIGN PATENT DOCUMENTS

CN 105118927 A 12/2015

OTHER PUBLICATIONS

Chinese Office Action for Chinese Application No. 201610021164.1, dated Aug. 12, 2016, 6 Pages.

*Primary Examiner* — Nicholas Tobergte
(74) *Attorney, Agent, or Firm* — Brooks Kushman P.C.

(57) ABSTRACT

The present disclosure provides a method of packaging an OLED apparatus, an OLED packaging apparatus and a display device, and relates to the field of the OLED. The method includes steps: forming a first inorganic thin film layer on an OLED to be packaged; forming a groove on a surface of the first inorganic thin film layer; forming a second organic thin film layer within the groove; and forming a third inorganic thin film layer covering the first inorganic thin film layer and the second organic thin film layer.

19 Claims, 4 Drawing Sheets

(56) References Cited

U.S. PATENT DOCUMENTS

2014/0183470 A1* 7/2014 Kim .................. H01L 27/3276
                                                      257/40
2016/0258060 A1* 9/2016 Huh .................... C23C 16/455

* cited by examiner

METHOD FOR PACKAGING ORGANIC LIGHT-EMITTING DIODE APPARATUS, ORGANIC LIGHT-EMITTING DIODE PACKAGING APPARATUS AND DISPLAY DEVICE

CROSS-REFERENCE TO RELATED APPLICATIONS

This application claims priority to Chinese application No. 201610021164.1, filed Jan. 13, 2016, which is hereby incorporated by reference in its entirety.

TECHNICAL FIELD

The present disclosure relates to the field of the Organic Light-Emitting Diode (OLED), in particular to a method for packaging an OLED apparatus, an OLED packaging apparatus and a display device.

BACKGROUND

Due to advantages such as an all-solid-state structure, high brightness, all perspectives, a high response speed and a flexible display, the OLED has become a new generation of display means with absolute competitiveness and good prospect for development. As shown in studies, components such as the moisture and the oxygen in the air greatly influence the life service of the OLED. Thus, when the OLED is effectively packaged, the OLED can be sufficiently isolated from the components such as the moisture and the oxygen in the air. Therefore, the service life of the OLED may be greatly prolonged so that the service life of the display device including the OLED can be prolonged.

At the present, most of the OLED are packaged in a thin film encapsulation (TFE). Regarding the TFE packaging manner, a first inorganic thin film layer, a second organic thin film layer and a third inorganic thin film layer are sequentially deposited on the OLED to be packaged so as to protect the OLED.

The second organic thin film layer generally is formed in a manner of ink-jet printing. During the forming process, organic materials are easily flown, which enables the finally molded second organic thin film layer to have uneven edges. Therefore, the first inorganic thin film layer and the third inorganic thin film layer cannot contact each other to be fused, which enables a poor TFE encapsulation effect and a reduction of the yield of the OLED.

SUMMARY

An object of the present disclosure is to solve the problem of uneven edges of the second organic thin film layer in the TFE film forming method in related arts. In some embodiments, the present disclosure provides a method of packaging an OLED apparatus, an OLED packaging apparatus and a display device. The technical solution goes as follows:

In one aspect, the present disclosure provides a method of packaging an OLED apparatus, which includes steps:
  forming a first inorganic thin film layer on an OLED to be packaged;
  forming a groove on a surface of the first inorganic thin film layer;
  forming a second organic thin film layer within the groove;
  forming a third inorganic thin film layer covering the first inorganic thin film layer and the second organic thin film layer.

Optionally, forming the groove on the surface of the first inorganic thin film layer includes etching the surface of the first inorganic thin film layer by a dry etching so as to form the groove.

Optionally, forming the first inorganic thin film layer on the OLED to be packaged includes forming the first inorganic thin film layer by a chemical vapor deposition or an atomic layer deposition.

Optionally, a pattern of a mask plate used in the dry etching is the same as a pattern of a mask plate used in the chemical vapor deposition or in the atomic layer deposition. A side length of the pattern of the mask plate used in the dry etching is smaller than a side length of the pattern of the mask plate used in the chemical vapor deposition or in the atomic layer deposition by 0.01-0.5 mm.

Optionally, a depth of the groove ranges from 0.1 to 0.8 μm.

Optionally, a shape of a bottom surface of the groove that is close to the OLED is the same as a shape of a surface of the first inorganic thin film layer where the groove is formed.

Optionally, a distance between the edge of the groove and the edge of the first inorganic thin film layer ranges from 5 to 250 μm.

Optionally, the OLED to be packaged includes a substrate and an OLED light-emitting structure provided on the substrate, and the first inorganic thin film layer covers the OLED light-emitting structure, and is bonded to the substrate.

Optionally, the second organic thin film layer generally is formed by an ink-jet printing.

Optionally, a thickness of the second organic thin film layer is greater than a depth of the groove.

Optionally, a material of the first inorganic thin film layer is the same as a material of the third inorganic thin film layer.

In a further aspect, the present disclosure provides an OLED packaging apparatus, which includes a first inorganic thin film layer provided on the OLED, wherein a groove is arranged at a surface of the first inorganic thin film layer; a second organic thin film layer provided within the groove; and a third inorganic thin film layer that covers the first inorganic thin film layer and the second organic thin film layer.

Optionally, the depth of the groove ranges from 0.1 to 0.8 μm.

Optionally, a shape of a bottom surface of the groove that is close to the OLED is the same as a shape of a surface of the first inorganic thin film layer where the groove is formed.

Optionally, the distance between the edge of the groove and the edge of the first inorganic thin film layer ranges from 5 to 250 μm.

Optionally, the thickness of the second organic thin film layer is greater than the depth of the groove.

Optionally, the material of the first inorganic thin film layer is the same as a material of the third inorganic thin film layer.

In a still further aspect, the present disclosure provides a display device, which includes the apparatus for packaging an OLED and the OLED to be packaged mentioned in the further aspect, wherein the OLED to be packaged includes a substrate and an OLED light-emitting structure provided on the substrate, and the first inorganic thin film layer covers the OLED light-emitting structure and is bonded to the substrate.

Optionally, a thickness of the second organic thin film layer is greater than the depth of the groove.

Optionally, a projection of the second organic thin film layer on the substrate is within a projection of the groove on the substrate, and a surface of the first inorganic thin film layer toward the third inorganic thin film layer excepting a portion of the groove contacts the third inorganic thin film layer so that the first inorganic thin film layer and the third inorganic thin film layer are fused with each other.

The technical solution in some embodiments of the present disclosure has the following beneficial effects:

a groove is formed on the first inorganic thin film layer, and the second organic thin film layer is formed within the groove. During the process of forming the second organic thin film layer, the inorganic thin film at a periphery of the groove functions as a barricade of the second organic thin film layer, so that a flow of the organic material is blocked by the barricade, thereby to guarantee a level edge of the second layer of the organic thin film and guarantee the encapsulation effect. In addition, with such a design, the first inorganic thin film layer sufficiently contacts the third inorganic thin film layer, thereby to guarantee the fusion of the two layers of films and further guarantee the encapsulation strength and effect.

DESCRIPTION OF THE DRAWINGS

In order to illustrate the technical solutions in embodiments of the present disclosure in a clearer manner, the drawings used in the embodiments will be described hereinafter briefly.

Obviously, the following drawings merely relate to some embodiments of the present disclosure, and based on these drawings, a person skilled in the art may obtain the other drawings without any creative effort.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In order to make the objects, the technical solutions and the advantages of the present disclosure more apparent, the present disclosure will be described hereinafter in a clear and complete manner in conjunction with the drawings.

Figure 1:
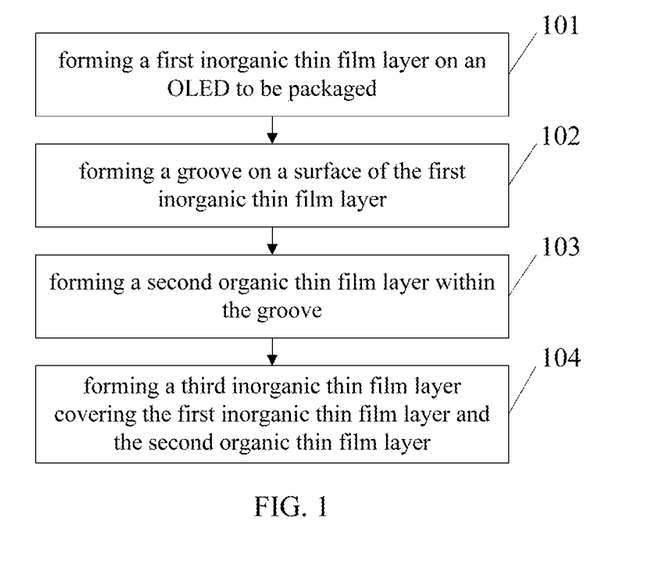
FIG. 1 is a flow chart showing a method of packaging an OLED apparatus in some embodiments of the present disclosure.

FIG. 1 is a flow chart showing a method of packaging an OLED apparatus in some embodiments of the present disclosure. Referring to FIG. 1, this method includes steps:

step S101: forming a first inorganic thin film layer on an OLED to be packaged;

step S102: forming a groove on a surface of the first inorganic thin film layer;

step S103: forming a second organic thin film layer within the groove;

step S104: forming a third inorganic thin film layer covering the first inorganic thin film layer and the second organic thin film layer.

In some embodiments of the present disclosure, a groove is formed on the first inorganic thin film layer, and the second organic thin film layer is formed within the groove. During the process of forming the second organic thin film layer, the inorganic thin film at a periphery of the groove functions as a barricade of the second organic thin film layer, so that a flow of the organic material is blocked by the barricade, thereby to guarantee a level edge of the second layer of the organic thin film and guarantee the encapsulation effect. In addition, with such a design, the first inorganic thin film layer sufficiently contacts the third inorganic thin film layer, thereby to guarantee the fusion of the two layers of films and further guarantee the encapsulation strength and effect.

Figure 2:
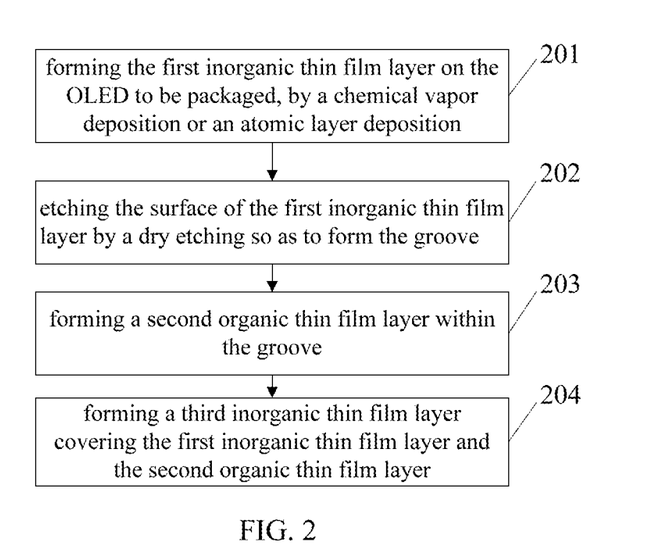
FIG. 2 is a flow chart showing a method of packaging an OLED apparatus in some embodiments of the present disclosure.

FIG. 2 is a flow chart showing a method of packaging an OLED apparatus in some embodiments of the present disclosure. Referring to FIG. 2, this method includes steps:

step S201: forming a first inorganic thin film layer on an OLED to be packaged by a chemical vapor deposition or by an atomic layer deposition.

Figure 2A:
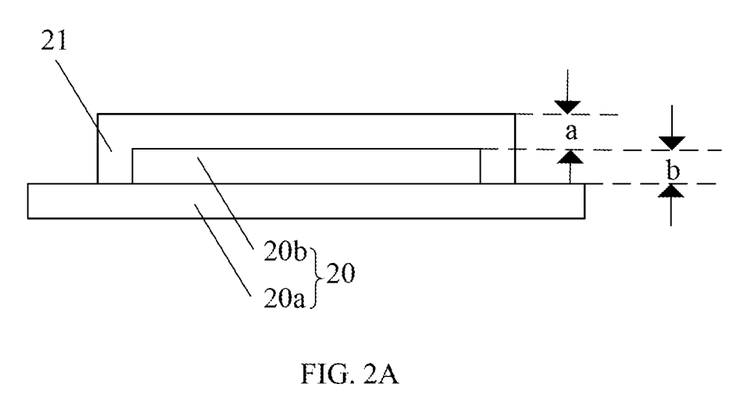
FIG. 2A is a schematic view of an OLED apparatus during an packaging process in some embodiments of the present disclosure.

As shown in FIG. 2A, in some embodiments of the present disclosure, an OLED 20 to be packaged includes a substrate 20a and an OLED light-emitting structure 20b provided on the substrate 20a, and the first inorganic thin film layer 21 covers the OLED light-emitting structure 20b and is bonded to the substrate 20a.

The substrate 20a includes but not limited to, a base substrate and a thin film transistor (TFT) provided on the base substrate, and the base substrate may be a glass substrate. The OLED light-emitting structure 20b includes but not limited to an anode layer, a cathode layer and an organic functional layer.

The first inorganic thin film layer 21 includes, but not limited to, a SiNx or SiON, a thin film thickness a (a thickness present prior to a formation of the groove) of the first inorganic thin film layer 21 on the OLED light-emitting structure 20b may range from 0.6 to 1.8 µm, and a thickness b of a sidewall of the first inorganic thin film layer 21, which encloses the OLED light-emitting structure 20b, ranges from 0.1 to 1 µm.

Step S202: forming a groove on a surface of the first inorganic thin film layer by a dry etching so as to form a groove. The process of forming a groove by a dry etching is easy.

In some embodiments of the present disclosure, a pattern of a mask plate used in the dry etching is the same as a pattern of a mask plate used in the chemical vapor deposition or in the atomic layer deposition. A side length of the pattern of the mask plate used in the dry etching is smaller than a side length of the pattern of the mask plate used in the chemical vapor deposition or in the atomic layer deposition by 0.01-0.5 mm. Therefore, the mask plate having a pattern whose size is smaller than the size of the mask plate used when the first inorganic thin film is formed is used to manufacture a groove so as to form the above groove on the first inorganic thin film layer. The pattern of the above mask plate refers to a shape of the pattern of the mask plate.

Figure 2B:
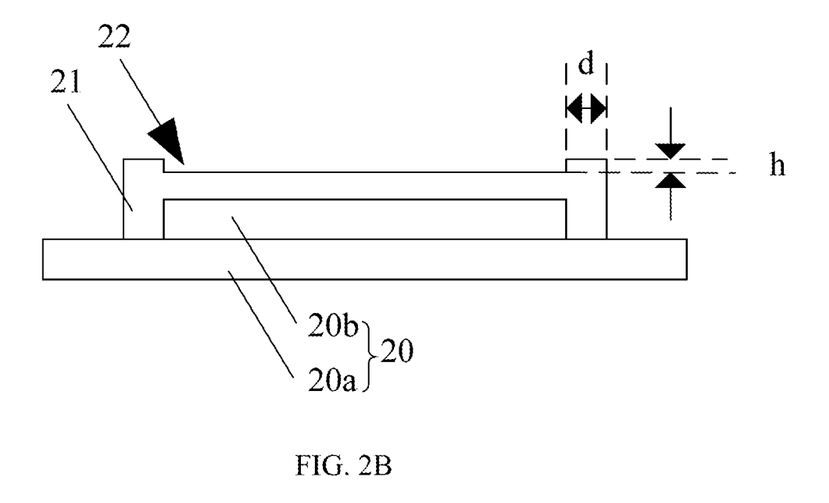
FIG. 2B is a schematic view of an OLED apparatus during an packaging process in some embodiments of the present disclosure.

As shown in FIG. 2B, a groove 22 is formed on a surface of the first inorganic thin film layer 21.

As shown in FIG. 2B, in some embodiments of the present disclosure, a depth h of the groove 22 ranges from 0.1 to 0.8 μm. Such a depth guarantees that the organic materials do not overflow upon forming the second layer of organic film and that the thickness of the first inorganic thin film layer is not excessively thinned due to a large depth of the groove. At this time, the thickness of the remaining film of the first inorganic thin film layer 21 may range from 0.5 to 1 μm.

Figure 2C:
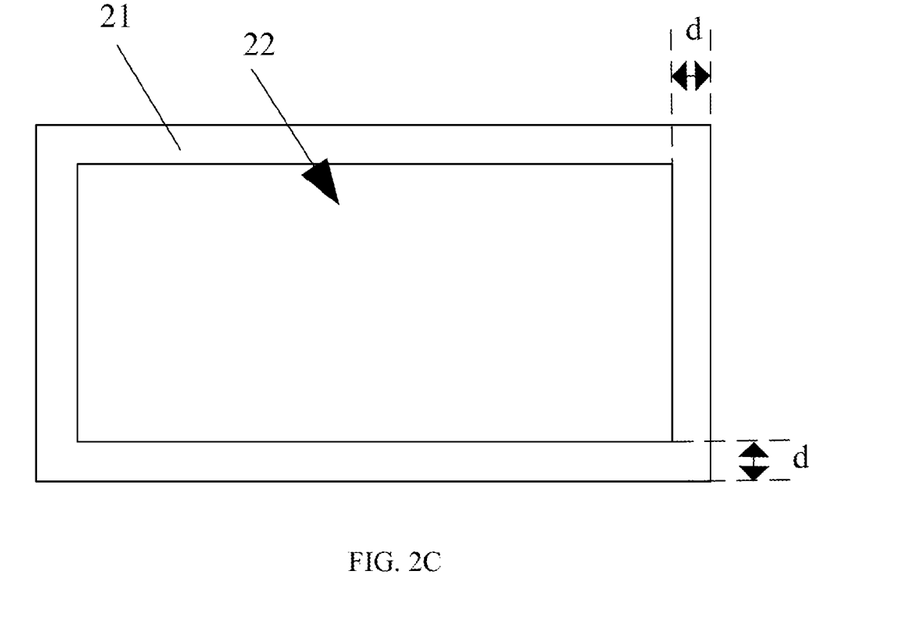
FIG. 2C is a schematic view of an OLED apparatus during an packaging process in some embodiments of the present disclosure.

FIG. 2C is a top view showing the first inorganic thin film layer 21 after the groove 22 is formed. As shown in FIG. 2C, in some embodiments of the present disclosure, the shape of the groove 22 is the same as the shape of the first inorganic thin film layer 21. For example, the groove 22 and the first inorganic thin film layer 21 are rectangle, as shown in FIG. 2C.

As shown in FIGS. 2B and 2C, in some embodiments of the present disclosure, a distance d between the edge of the groove 22 and the edge of the first inorganic thin film layer 21 may range from 5 to 250 μm. This distance guarantees that the organic materials cannot overflow and guarantees that the area of the second organic thin film does not become too small.

In some embodiments of the present disclosure, the shape of the groove 22 may be different from the shape of the first inorganic thin film layer 21. For example, the first inorganic thin film layer 21 is a rectangle, and the groove 22 is an ellipse or a circle, which is not limited herein.

Step S203: forming a second organic thin film layer within the groove.

In some embodiments of the present disclosure, the second organic thin film layer is formed by an ink-jet printing.

Figure 2D:
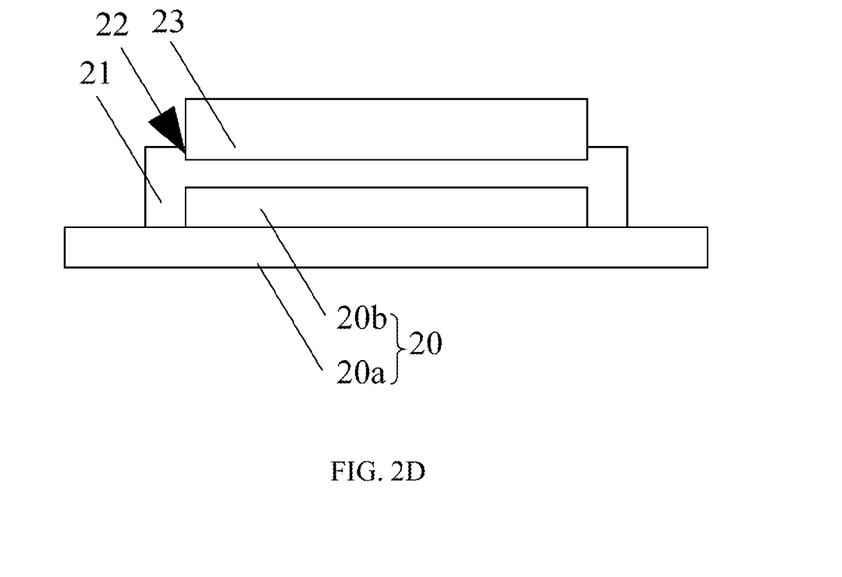
FIG. 2D is a schematic view of an OLED apparatus during an packaging process in some embodiments of the present disclosure.

As shown in FIG. 2D, the second organic thin film layer 23 is formed in the groove 22, and the thickness of the second organic thin film layer 23 is greater than the depth of the groove 22.

The second organic thin film layer 23 includes, but not limited to, a transparent organic monomer material film layer without outgas (the organic monomer material cannot be volatilized to generate the gas), and the thickness of the second organic thin film layer 23 may range from 4 to 15 μm.

Step S204: forming a third inorganic thin film layer covering the first inorganic thin film layer and the second organic thin film layer.

Figure 2E:
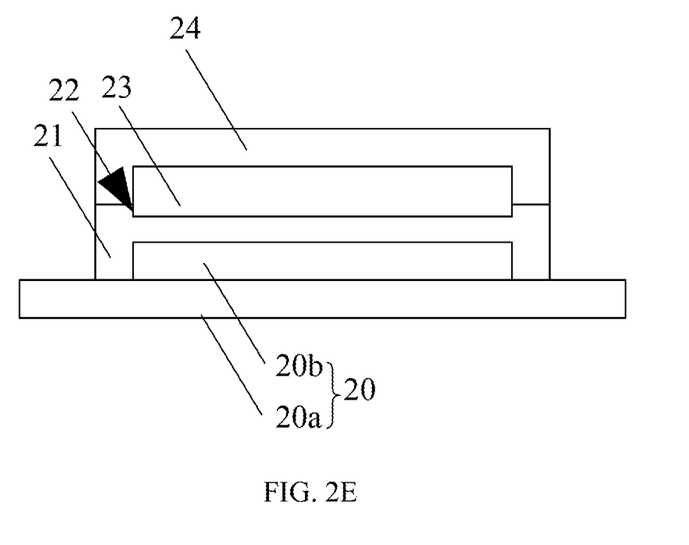
FIG. 2E is a schematic view of an OLED apparatus during an packaging process in some embodiments of the present disclosure.

As shown in FIG. 2E, the third inorganic thin film layer 24 is formed on the second organic thin film layer 23. The material of the third inorganic thin film layer 24 is the same as the material of the first inorganic thin film layer 21, and it includes, but not limited to, the film layers such as SiNx or SiON. The thickness of the third inorganic thin film layer 24 may range from 0.5 to 1 μm, and a thickness of a sidewall of the third inorganic thin film layer 24 enclosing the second organic thin film layer 23 ranges from 3.9 to 14.2 μm. Specifically, the second organic thin film layer 23 is provided in the groove 22, and its size is smaller than that of the first inorganic thin film layer 21. Therefore, when the third inorganic thin film layer 24 is formed, it not only covers the second organic thin film layer 23, but can cover a portion of the first inorganic thin film layer 21 at a periphery of the groove 22, thereby to realize a contact between the first inorganic thin film layer 21 and the third inorganic thin film layer 24 and guarantee a fusion between the first inorganic thin film layer 21 and the third inorganic thin film layer 24.

In some embodiments of the present disclosure, a groove is formed on the first inorganic thin film layer, and the second organic thin film layer is formed within the groove. During the process of forming the second organic thin film layer, the inorganic thin film at a periphery of the groove functions as a barricade of the second organic thin film layer, so that a flow of the organic material is blocked by the barricade, thereby to guarantee a level edge of the second layer of the organic thin film and guarantee the encapsulation effect. In addition, with such a design, the first inorganic thin film layer sufficiently contacts the third inorganic thin film layer, thereby to guarantee the fusion of the two layers of films and further guarantee the encapsulation strength and effect.

Figure 3:
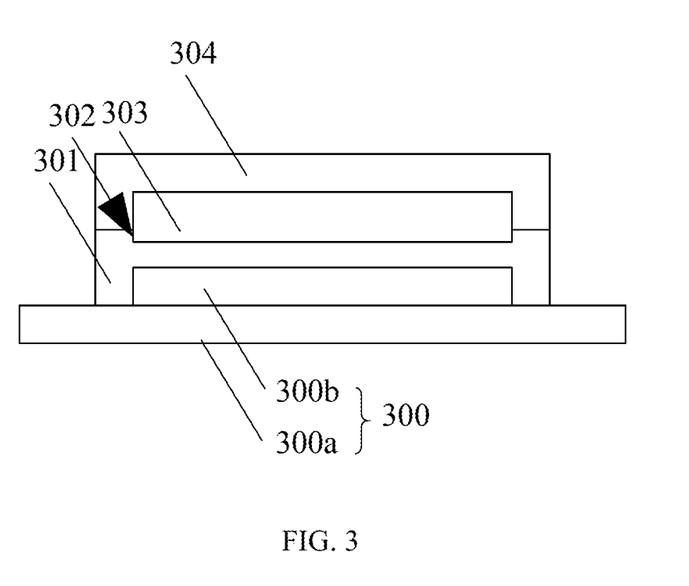
FIG. 3 is a schematic view of an OLED packaging apparatus in some embodiments of the present disclosure.

FIG. 3 is a schematic view of an OLED packaging apparatus in some embodiments of the present disclosure. As shown in FIG. 3, the OLED packaging apparatus includes a first inorganic thin film layer 301 provided on the OLED 300, wherein a groove 302 is arranged at a surface of the first inorganic thin film layer 301; a second organic thin film layer 303 provided within the groove 302; and a third inorganic thin film layer 304 that covers the first inorganic thin film layer 301 and the second organic thin film layer 303.

In some embodiments of the present disclosure, the depth of the groove 302 ranges from 0.1 to 0.8 μm. Such a depth guarantees that the organic materials do not overflow upon forming the second layer of organic film and that the thickness of the first inorganic thin film layer is not excessively thinned due to a large depth of the groove.

In some embodiments of the present disclosure, a shape of the groove 302 is the same as a shape of the first inorganic thin film layer 301.

In some embodiments, the distance between the edge of the groove 302 and the edge of the first inorganic thin film layer 301 ranges from 5 to 250 μm. Such a distance guarantees that the organic materials do not overflow and that the area of the second organic thin film layer does not become too small.

In some embodiments of the present disclosure, the OLED 300 includes a substrate 300a and the OLED light-emitting structure 300b provided on the substrate 300a, and the first inorganic thin film layer 301 covers the OLED light-emitting structure 300b and is bonded to the substrate 300a. Of course, in some embodiments of the present disclosure, the OLED 300 can also be of structures, which is not limited herein.

In some embodiments of the present disclosure, a groove is formed on the first inorganic thin film layer, and the second organic thin film layer is formed within the groove. During the process of forming the second organic thin film layer, the inorganic thin film at a periphery of the groove functions as a barricade of the second organic thin film layer, so that a flow of the organic material is blocked by the barricade, thereby to guarantee a level edge of the second layer of the organic thin film and guarantee the encapsulation effect. In addition, with such a design, the first inorganic thin film layer sufficiently contacts the third inorganic thin film layer, thereby to guarantee the fusion of the two layers of films and further guarantee the encapsulation strength and effect.

In some embodiments, the present disclosure further provides a display device. The display device includes the apparatus for packaging an OLED shown in FIG. 3.

In some embodiments of the present disclosure, a groove is formed on the first inorganic thin film layer, and the second organic thin film layer is formed within the groove. During the process of forming the second organic thin film layer, the inorganic thin film at a periphery of the groove functions as a barricade of the second organic thin film layer, so that a flow of the organic material is blocked by the barricade, thereby to guarantee a level edge of the second layer of the organic thin film and guarantee the encapsulation effect. In addition, with such a design, the first inorganic thin film layer sufficiently contacts the third inorganic thin film layer, thereby to guarantee the fusion of the two layers of films and further guarantee the encapsulation strength and effect.

The above are merely the preferred embodiments of the present disclosure, and are not used to limit the present disclosure. A person skilled in the art may make further modifications, equivalent substitutions and improvements within the principle and the spirit of the present disclosure, and these modifications, equivalent substitutions and improvements shall also fall within the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of packaging an Organic Light-Emitting Diode (OLED) apparatus, comprising steps:
   forming a first inorganic thin film layer on an OLED to be packaged;
   forming a groove in a surface of the first inorganic thin film layer;
   forming a second organic thin film layer within the groove; and
   forming a third inorganic thin film layer covering the first inorganic thin film layer and the second organic thin film layer.

2. The method according to claim 1, wherein the step of forming the groove in the surface of the first inorganic thin film layer comprises:
   etching the surface of the first inorganic thin film layer by dry etching so as to form the groove.

3. The method according to claim 2, wherein the step of forming the first inorganic thin film layer on the OLED to be packaged comprises:
   forming the first inorganic thin film layer by chemical vapor deposition or atomic layer deposition.

4. The method according to claim 3, wherein a pattern of a mask plate used in the dry etching is the same as a pattern of a mask plate used in the chemical vapor deposition or in the atomic layer deposition, and
   a side length of the pattern of the mask plate used in the dry etching is smaller than a side length of the pattern of the mask plate used in the chemical vapor deposition or in the atomic layer deposition by 0.01-0.5 mm.

5. The method according to claim 1, wherein a depth of the groove ranges from 0.1 to 0.8 μm.

6. The method according to claim 1, wherein a shape of a bottom surface of the groove close to the OLED is the same as a shape of the surface of the first inorganic thin film layer where the groove is formed.

7. The method according to claim 6, wherein a distance between an edge of the groove and an edge of the first inorganic thin film layer ranges from 5 to 250 μm.

8. The method according to claim 1, wherein the OLED to be packaged comprises a substrate and an OLED light-emitting structure provided on the substrate, and the first inorganic thin film layer covers the OLED light-emitting structure and is bonded to the substrate.

9. The method according to claim 1, wherein the second organic thin film layer is formed by ink-jet printing.

10. The method according to claim 1, wherein a thickness of the second organic thin film layer is greater than a depth of the groove.

11. The method according to claim 1, wherein a material of the first inorganic thin film layer is the same as a material of the third inorganic thin film layer.

12. An Organic Light-Emitting Diode (OLED) packaging apparatus, comprising:
   a first inorganic thin film layer provided on an OLED, wherein a groove is arranged in a surface of the first inorganic thin film layer;
   a second organic thin film layer provided within the groove; and
   a third inorganic thin film layer that covers the first inorganic thin film layer and the second organic thin film layer;
   a shape of a bottom surface of the groove close to the OLED is the same as a shape of a surface of the first inorganic thin film layer where the groove is formed.

13. The apparatus according to claim 12, wherein a depth of the groove ranges from 0.1 to 0.8 μm.

14. The apparatus according to claim 12, wherein a distance between an edge of the groove and an edge of the first inorganic thin film layer ranges from 5 to 250 μm.

15. The apparatus according to claim 12, wherein a thickness of the second organic thin film layer is greater than a depth of the groove.

16. The apparatus according to claim 12, wherein a material of the first inorganic thin film layer is the same as a material of the third inorganic thin film layer.

17. A display device, comprising the packaging apparatus according to claim 12 and an Organic Light-Emitting Diode (OLED) to be packaged,
   wherein the OLED to be packaged comprises a substrate and an OLED light-emitting structure provided on the substrate, and the first inorganic thin film layer covers the OLED light-emitting structure and is bonded to the substrate;
   wherein a thickness of the second organic thin film layer is greater than a depth of the groove.

18. The display device according to claim 17, wherein a projection of the second organic thin film layer on the substrate is within a projection of the groove on the substrate, and a surface of the first inorganic thin film layer facing the third inorganic thin film layer, except the groove, contacts the third inorganic thin film layer, so that the first inorganic thin film layer and the third inorganic thin film layer are fused with each other.

19. A display device, comprising an Organic Light-Emitting Diode (OLED) packaging apparatus and an OLED to be packaged, wherein the OLED packaging apparatus comprises:
- a first inorganic thin film layer provided on an OLED, wherein a groove is arranged in a surface of the first inorganic thin film layer;
- a second organic thin film layer provided within the groove; and
- a third inorganic thin film layer that covers the first inorganic thin film layer and the second organic thin film layer;
- wherein the OLED to be packaged comprises a substrate and an OLED light-emitting structure provided on the substrate, and the first inorganic thin film layer covers the OLED light-emitting structure and is bonded to the substrate;
- a projection of the second organic thin film layer on the substrate is within a projection of the groove on the substrate, and a surface of the first inorganic thin film layer facing the third inorganic thin film layer, except the groove, contacts the third inorganic thin film layer, so that the first inorganic thin film layer and the third inorganic thin film layer are fused with each other.

* * * * *